United States Patent
Rainville et al.

(10) Patent No.: US 10,651,080 B2
(45) Date of Patent: May 12, 2020

(54) OXIDIZING TREATMENT OF ALUMINUM NITRIDE FILMS IN SEMICONDUCTOR DEVICE MANUFACTURING

(71) Applicant: Lam Research Corporation, Fremont, CA (US)

(72) Inventors: Meliha Gozde Rainville, Beaverton, OR (US); Nagraj Shankar, Tualatin, OR (US); Daniel Damjanovic, Sherwood, OR (US); Kapu Sirish Reddy, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 404 days.

(21) Appl. No.: 15/195,539

(22) Filed: Jun. 28, 2016

(65) Prior Publication Data

US 2017/0309514 A1    Oct. 26, 2017

Related U.S. Application Data

(60) Provisional application No. 62/327,742, filed on Apr. 26, 2016.

(51) Int. Cl.
  *H01L 21/00* (2006.01)
  *H01L 21/768* (2006.01)
  (Continued)

(52) U.S. Cl.
  CPC .... *H01L 21/76834* (2013.01); *H01L 21/0223* (2013.01); *H01L 21/0234* (2013.01);
  (Continued)

(58) Field of Classification Search
  CPC ............................................. H01L 21/76834
  See application file for complete search history.

(56) References Cited

U.S. PATENT DOCUMENTS 6,001,420 A   12/1999  Mosely et al.
6,416,822 B1   7/2002  Chiang et al.
(Continued)

FOREIGN PATENT DOCUMENTS

KR   10-2006-064967 A    6/2006
KR   10-2014-0129618 A   11/2014

OTHER PUBLICATIONS

U.S. Appl. No. 14/949,533, filed Nov. 23, 2015 entitled "Methods for Formation of Low-K Aluminum-Containing Etch Stop Films" by Damjanovic et al.
(Continued)

*Primary Examiner* — Kimberly N Rizkallah
*Assistant Examiner* — Alexander Belousov
(74) *Attorney, Agent, or Firm* — Weaver Austin Villeneuve & Sampson LLP

(57) ABSTRACT

Thin AlN films are oxidatively treated in a plasma to form AlO and AlON films without causing damage to underlying layers of a partially fabricated semiconductor device (e.g., to underlying metal and/or dielectric layers). The resulting AlO and AlON films are characterized by improved leakage current compared to the AlN film and are suitable for use as etch stop layers. The oxidative treatment involves contacting the substrate having an exposed AlN layer with a plasma formed in a process gas comprising an oxygen-containing gas and a hydrogen-containing gas. In some implementations oxidative treatment is performed with a plasma formed in a process gas including $CO_2$ as an oxygen-containing gas, $H_2$ as a hydrogen-containing gas, and further including a diluent gas. The use of a hydrogen-containing gas in the plasma eliminates the oxidative damage to the underlying layers.

17 Claims, 7 Drawing Sheets

(51) Int. Cl.
  *H01L 21/02* (2006.01)
  *H01L 21/027* (2006.01)
  *H01L 21/311* (2006.01)
  *H01L 21/033* (2006.01)
(52) U.S. Cl.
  CPC .... *H01L 21/0274* (2013.01); *H01L 21/02178* (2013.01); *H01L 21/02326* (2013.01); *H01L 21/0332* (2013.01); *H01L 21/0337* (2013.01); *H01L 21/31144* (2013.01); *H01L 21/76826* (2013.01); *H01L 21/02252* (2013.01)

(56) References Cited

U.S. PATENT DOCUMENTS

| | | |
|---|---|---|
| 6,428,859 B1 | 8/2002 | Chiang et al. |
| 6,576,053 B1 | 6/2003 | Kim et al. |
| 6,867,152 B1 | 3/2005 | Hausmann et al. |
| 7,202,185 B1 | 4/2007 | Hausmann et al. |
| 7,273,822 B2 | 9/2007 | Yeo et al. |
| 7,576,006 B1 | 8/2009 | Yu et al. |
| 7,648,899 B1 | 1/2010 | Banerji et al. |
| 7,776,763 B2 | 8/2010 | Reid et al. |
| 7,790,633 B1 | 9/2010 | Tarafdar et al. |
| 7,858,510 B1* | 12/2010 | Banerji ............... C23C 16/0227 257/E21.269 |
| 8,747,964 B2 | 6/2014 | Park et al. |
| 8,921,892 B2* | 12/2014 | Palacios ............ H01L 29/42316 257/192 |
| 9,190,489 B1 | 11/2015 | Mountsier et al. |
| 9,245,792 B2 | 1/2016 | Chen et al. |
| 9,397,003 B1* | 7/2016 | Niimi ............. H01L 21/823418 |
| 9,633,896 B1 | 4/2017 | Damjanovic et al. |
| 9,859,153 B1 | 1/2018 | Rainville et al. |
| 10,049,869 B2 | 8/2018 | Reddy et al. |
| 10,418,236 B2 | 9/2019 | Reddy et al. |
| 2002/0155695 A1 | 10/2002 | Lee et al. |
| 2003/0209738 A1 | 11/2003 | Ohto et al. |
| 2003/0213987 A1 | 11/2003 | Basceri et al. |
| 2004/0043149 A1 | 3/2004 | Gordon et al. |
| 2004/0063308 A1 | 4/2004 | Bao et al. |
| 2004/0198069 A1 | 10/2004 | Metzner et al. |
| 2005/0001318 A1 | 1/2005 | Won |
| 2005/0003662 A1 | 1/2005 | Jursich et al. |
| 2005/0199945 A1 | 9/2005 | Kodama et al. |
| 2005/0239243 A1 | 10/2005 | Tran et al. |
| 2005/0271813 A1 | 12/2005 | Kher et al. |
| 2007/0049043 A1 | 3/2007 | Muthukrishnan et al. |
| 2008/0079111 A1 | 4/2008 | Clark |
| 2008/0081113 A1 | 4/2008 | Clark |
| 2008/0138969 A1 | 6/2008 | Kaneko et al. |
| 2009/0039416 A1 | 2/2009 | Lai et al. |
| 2010/0062149 A1 | 3/2010 | Ma et al. |
| 2010/0113265 A1 | 5/2010 | Suzuki et al. |
| 2011/0065276 A1 | 3/2011 | Ganguly et al. |
| 2012/0202301 A1 | 8/2012 | Yaegashi |
| 2012/0241958 A1 | 9/2012 | Streck et al. |
| 2013/0153963 A1 | 6/2013 | Shealy et al. |
| 2013/0171810 A1 | 7/2013 | Sun et al. |
| 2013/0330936 A1 | 12/2013 | Lachaud et al. |
| 2014/0017414 A1 | 1/2014 | Fukazawa et al. |
| 2014/0367774 A1* | 12/2014 | Yoo ..................... H01L 29/4236 257/330 |
| 2015/0179706 A1 | 6/2015 | Rocklein et al. |
| 2016/0017487 A1 | 1/2016 | Chen et al. |
| 2016/0071735 A1 | 3/2016 | Yen |
| 2016/0133572 A1 | 5/2016 | Zhang et al. |
| 2016/0181066 A1* | 6/2016 | Brors .................. H01M 4/0423 429/219 |
| 2016/0307766 A1 | 10/2016 | Jongbloed et al. |
| 2017/0103914 A1 | 4/2017 | Damjanovic et al. |
| 2018/0096886 A1 | 4/2018 | Reddy et al. |
| 2018/0197770 A1 | 7/2018 | Rainville et al. |
| 2018/0342389 A1 | 11/2018 | Reddy et al. |

OTHER PUBLICATIONS

Frietas, Jr., J.A. et al., "Structural and optical properties of thick freestanding AlN films prepared by hydride vapor phase epitaxy," *Journal of Crystal Growth* 350 [2012 (Available online Dec. 30, 2011)] pp. 33-37.
U.S. Office Action, dated Jun. 29, 2016, issued in U.S. Appl. No. 14/949,533.
U.S. Notice of Allowance, dated Dec. 21, 2016, issued in U.S. Appl. No. 14/949,533.
U.S. Office Action, dated Oct. 6, 2017, issued in U.S. Appl. No. 15/282,543.
U.S. Notice of Allowance, dated Apr. 18, 2018, issued in U.S. Appl. No. 15/282,543.
U.S. Notice of Allowance, dated May 23, 2017, issued in U.S. Appl. No. 15/350,911.
U.S. Notice of Allowance, dated Aug. 25, 2017, issued in U.S. Appl. No. 15/350,911.
PCT International Search Report and Written Opinion (ISA/KR) dated Jan. 8, 2018 issued in PCT/US2017/053764.
Jeon et al. (2002) "Atomic Layer Deposition of $Al_2O_3$ Thin Films Using Trimethylaluminum and Isopropyl Alcohol," *Journal of the Electrochemical Society*, 149(6):C306-C310.
Ritala et al. (Apr. 14, 2000) "Atomic Layer Deposition of Oxide Thin Films with Metal Alkoxides as Oxygen Sources," *Science*, 288:319-321.
U.S. Appl. No. 16/037,932, filed Oct. 2, 2018, Reddy et al.
U.S. Office Action dated Oct. 4, 2018 issued in U.S. Appl. No. 16/037,932.
U.S. Notice of Allowance dated May 13, 2019 issued in U.S. Appl. No. 16/037,932.
PCT International Preliminary Report on Patentability (ISA/KR) dated Apr. 11, 2019 issued in PCT/US2017/053764.
US Ex Parte Quayle Action, dated Aug. 19, 2019, issued in U.S. Appl. No. 15/821,097.
U.S. Notice of Allowance dated Jan. 21, 2020, issued in U.S. Appl. No. 15/821,097.

\* cited by examiner

OXIDIZING TREATMENT OF ALUMINUM NITRIDE FILMS IN SEMICONDUCTOR DEVICE MANUFACTURING

CROSS-REFERENCE TO RELATED APPLICATIONS

This application claims benefit under 35 U.S.C. § 119(e) to U.S. Provisional Patent Application No. 62/327,742, filed Apr. 26, 2016, which is herein incorporated by reference in its entirety.

FIELD OF THE INVENTION

This invention pertains to methods for forming films in semiconductor device manufacturing. Specifically, this invention pertains to methods of forming aluminum-containing dielectric etch stop films over inter-layer dielectric (ILD) and metal layers.

BACKGROUND

In integrated circuit (IC) fabrication, metal lines (such as copper lines) are typically formed in ILD layers, where the ILD is often a porous silicon oxide based dielectric material or an organic dielectric material having a low dielectric constant, such as an ultra-low-k (ULK) dielectric. Formation of integrated circuits often requires patterning of the ILD to form vias and trenches, followed by subsequent filling of these vias and trenches with a metal (e.g., copper). After the vias and trenches are filled with a metal, a second layer of ILD is deposited, is patterned to form vias and trenches, and these recessed features are again filled with a metal, thereby resulting in a stack of ILD layers with embedded metal lines, where the metal lines form the conductive paths of an integrated circuit. Etch stop layers are often deposited over individual ILD layers, and are used in IC fabrication process to protect the material residing under the etch stop layer from being etched during patterning processes. For example, the semiconductor substrate may include an exposed first ILD layer, and an etch stop layer underlying the first ILD layer, and overlying a second ILD layer. The first ILD layer may be patterned and etched with a fluoride-based chemistry to define vias and trenches, while the etch stop layer protects the first ILD layer from being etched.

The etch stop layer material preferably should exhibit good etch selectivity versus the material that is being etched, that is, the etch stop layer material should preferably be etched at a significantly lower rate than the exposed ILD material.

The etch stop layer material typically is not completely removed during the integrated circuit fabrication, and remains in the final manufactured semiconductor device as a thin layer between thicker ILD layers. Examples of conventionally used etch stop layer materials include silicon carbide and silicon nitride. Because the etch stop layer remains in the manufactured semiconductor device its electrical properties are important. Specifically, etch stop layers with low leakage current are desired.

SUMMARY

Methods, apparatus, and systems for oxidatively treating thin AlN (aluminum nitride) films without causing substantial oxidation of layers that underlie AlN films are provided. The resulting oxidized films are exhibiting substantially reduced leakage current and are suitable for use in a variety of applications in semiconductor processing. For example, these layers can be used as etch stop layers and as sub-layers in diffusion barrier layers. In some embodiments the treated films are AlON or AlO films.

AlN films or aluminum nitride films, as used herein, are films that contain aluminum and nitrogen, and may optionally contain hydrogen. AlON films, as used herein, are films that contain aluminum, nitrogen, and oxygen, and, optionally may contain hydrogen. AlO films are films that contain aluminum and oxygen, and, optionally may contain hydrogen. Other elements may be present in these films in small amounts (typically less than about 5 atomic %). The films do not have to be stoichiometric. For example, content of aluminum oxygen and nitrogen in AlON films can vary. In some embodiments the AlON film contains between about 30-40% Al, between about 40-55% 0, and between about 5-30% N, where % are atomic % and hydrogen may be optionally present and is not included in the calculation.

In one aspect, a method for treating an AlN layer is provided. In some embodiment the method includes: (a) providing a semiconductor substrate having an exposed aluminum nitride layer to a process chamber; and (b) contacting the substrate in the process chamber with a plasma formed from a process gas comprising an oxygen-containing gas (e.g., $CO_2$), and a hydrogen-containing gas (e.g., $H_2$). The oxygen-containing gas is typically an oxidizing gas and the hydrogen-containing gas is typically a reducing gas. Examples of oxygen-containing gases include $CO_2$, $N_2O$, and $O_2$. Examples of hydrogen-containing gases include $NH_3$, $N_2H_4$, $H_2$, and $BH_3$. The process gas typically also includes a diluent gas such as He, Ar, Ne, $N_2$, or any mixture thereof. In some embodiments, the process gas comprising a hydrogen-containing gas and an oxygen-containing gas is introduced into the process chamber housing the substrate, and plasma is formed in that chamber. In other embodiments the process gas comprising a hydrogen-containing gas and an oxygen-containing gas is introduced into a chamber that is separated from the chamber housing the substrate; plasma is formed in the process gas and is then introduced into the process chamber housing the substrate. These embodiments are referred to as remote plasma embodiments. In some remote plasma embodiments, remote plasma is formed separately from individual components of the process gas (e.g., plasma is formed separately in the hydrogen-containing gas and in the oxygen-containing gas) and the resulting plasmas are then mixed and are allowed to contact the substrate.

In one embodiment, the modification of the AlN layer with the plasma is performed at a pressure of between about 0.5-10 Torr and at a process temperature of between about 250-650° C., such as at between about 300-400° C., where the temperature refers to pedestal (substrate support) temperature. For example, in some embodiments, the substrate is contacted under these process conditions with direct plasma. Plasma is formed in some embodiments using high frequency (HF) radio frequency (RF) plasma generation. In some embodiments plasma is formed using both HF RF and low frequency (LF) RF plasma generation.

The treatment modifies the structure of the AlN layer. In some embodiments the treatment reduces the leakage current (as compared with the original AlN layer). In some embodiments the leakage current of the treated layer is less than about $2 \times 10^{-6}$ $A/cm^2$ at 4 MV/cm. In some embodiments, the AlN layer resides on a layer containing metal (e.g., copper or tungsten) and dielectric, and the treatment does not cause substantial oxidation of the metal in the underlying metal layer. Oxidation of underlying layers is undesired and is often encountered during conventional oxidizing plasma treatment of thin layers. The extent of oxidation of the underlying layer can be assessed by measuring reflectivity of the substrate before and after oxidative treatment. In some embodiments, the decrease in reflectivity after oxidative post-treatment is 0.05 or less. The measured reflectivity value is a ratio of reflected light intensity to incoming light intensity, which is measured through the transparent AlN (modified and unmodified) layer. When copper is the underlying metal, typical reflectivity value is between 0.53-0.55 measured at the wavelength of 440 nm using an ellipsometer. In some embodiments no change in reflectivity is observed at this wavelength after oxidizing treatment provided herein.

The method is particularly suitable for treatment of thin AlN films, such as for treatment of films that are less than about 100 Å thick, such as for films that are between about 10-100 Å thick, 10-50 Å thick, and 10-30 Å thick. In some embodiments, such AlN film is deposited on a substrate comprising exposed metal and dielectric using a conformal deposition method, such as atomic layer deposition (ALD), including thermal and plasma-enhanced ALD (PEALD).

In another aspect, a semiconductor device is provided having two layers of ILD (e.g., a ULK dielectric) and a thin layer of provided AlON or AlO film (e.g., between about 10-100 Å thick, such as about 20 Å thick), residing between the two ILD layers. The ILD layers may also include embedded metal (e.g., copper or tungsten) lines, and, in some embodiments, the thin layer of AlON or AlO resides between metal and ILD. In some embodiments, provided layers are used as sub-layers of diffusion barrier layers residing at the interface between copper and ULK dielectric and preventing the diffusion of copper into dielectric. For example, a diffusion barrier layer may include a sublayer of an AlO or ALON material provided herein and a sublayer of diffusion barrier material, such as silicon carbide (e.g., oxygen-doped silicon carbide).

According to another aspect, an apparatus for oxidative treatment of AlN films is provided. The apparatus includes a process chamber and a controller. The controller includes program instructions for conducting any of the deposition and treatment methods provided herein. In some embodiments the apparatus is a plasma enhanced atomic layer deposition (PEALD or iALD) apparatus. In some embodiments the deposition of AlN and the oxidative treatment is performed in one chamber (e.g., in a PEALD process chamber). In other embodiments, deposition of AlN and oxidative post-treatment are performed in different process chambers.

According to another aspect, a system is provided herein which includes the apparatus for post-treatment of AlN layers and a stepper.

According to another aspect, a non-transitory computer machine-readable medium is provided, which includes program instructions for control of the apparatus. The instructions include code for treatment methods provided herein.

These and other aspects of implementations of the subject matter described in this specification are set forth in the accompanying drawings and the description below.

DETAILED DESCRIPTION

Figure 1A:
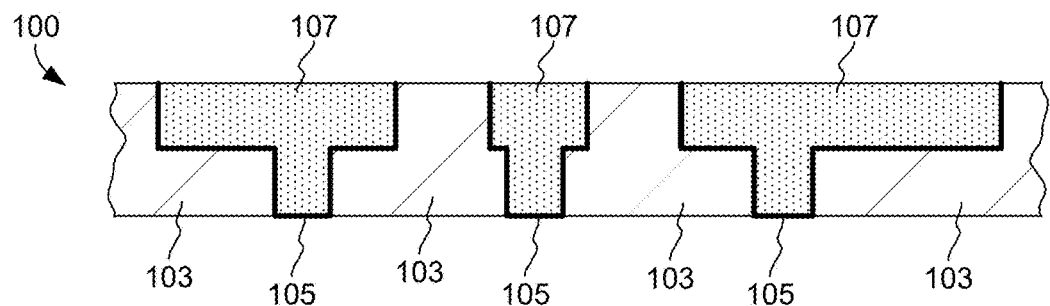
FIGS. 1A-1C show cross-sectional views of a semiconductor device during processing illustrating deposition and oxidative treatment of an AlN film according to an embodiment provided herein.

In the following detailed description, numerous specific implementations are set forth in order to provide a thorough understanding of the disclosed implementations. However, as will be apparent to those of ordinary skill in the art, the disclosed implementations may be practiced without these specific details or by using alternate elements or processes. In other instances well-known processes, procedures, and components have not been described in detail so as not to unnecessarily obscure aspects of the disclosed implementations.

In this application, the terms "semiconductor wafer," "wafer," "substrate," "wafer substrate" and "partially fabricated integrated circuit" are used interchangeably. One of ordinary skill in the art would understand that the term "partially fabricated integrated circuit" can refer to a silicon wafer during any of many stages of integrated circuit fabrication thereon. Further, the term "semiconductor substrate" refers to a substrate that contains a semiconductor material anywhere within the substrate, and may include layers of other materials. The following detailed description assumes the disclosed implementations are implemented on a wafer. However, the disclosed implementations are not so limited. The work piece may be of various shapes, sizes, and materials. In addition to semiconductor wafers, other work pieces that may take advantage of the disclosed implementations include various articles such as printed circuit boards and the like.

Methods are herein provided for an oxidative treatment of a thin AlN layer that substantially reduce the leakage current of the layer without causing significant oxidative damage to an underlying layer of metal or an underlying layer of dielectric.

In some embodiments, the leakage current is reduced by at least an order of magnitude, such as by at least two orders of magnitude, or by at least three orders of magnitude. In some embodiments leakage current of AlN layer was reduced by provided oxidative treatment from $6.2 \cdot 10^{-5}$ A/cm$^2$ to $1.6 \cdot 10^{-8}$ A/cm$^2$ at 4 MV/cm without causing oxidation of underlying copper layer detectable by reflectometry. Treated films (e.g., AlO and AlON films) characterized by leakage current of less than $1 \cdot 10^{-6}$ A/cm$^2$, such as less than $5 \cdot 10^{-7}$ A/cm$^2$, or less than $1 \cdot 10^{-7}$ A/cm$^2$ at 4 MV/cm are provided. Because untreated AlN films typically have poor electrical performance and create a possible electrical shortage pass in the formed device, an additional layer of material is deposited over an AlN layer to improve the electrical performance of the device. In contrast, treated AlO and AlON films provided herein can be used as single-film etch stop layers. In these embodiments deposition of additional layers on top of treated layers for improved electrical performance would not be required. In some embodiments the AlON films provided herein contain between about 30-40% Al, between about 40-55% O, and between about 5-30% N, where % are atomic % and hydrogen may be optionally present and is not included in the calculation.

Figure 1B:
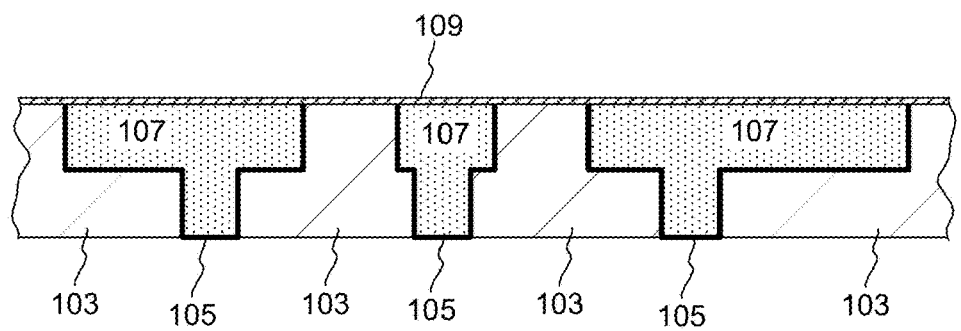
Figure 1C:
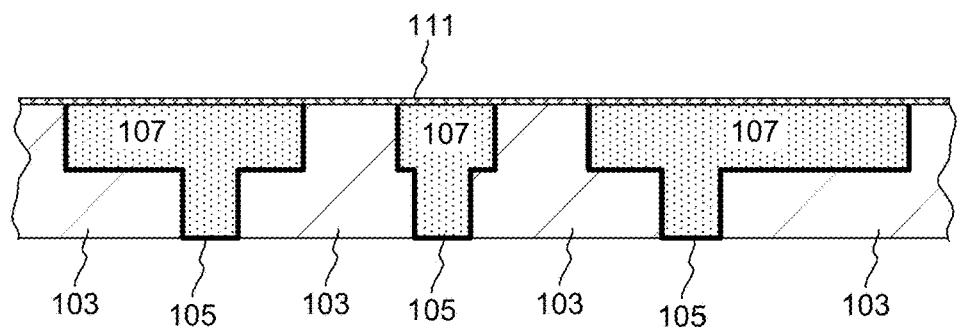
Figure 2:
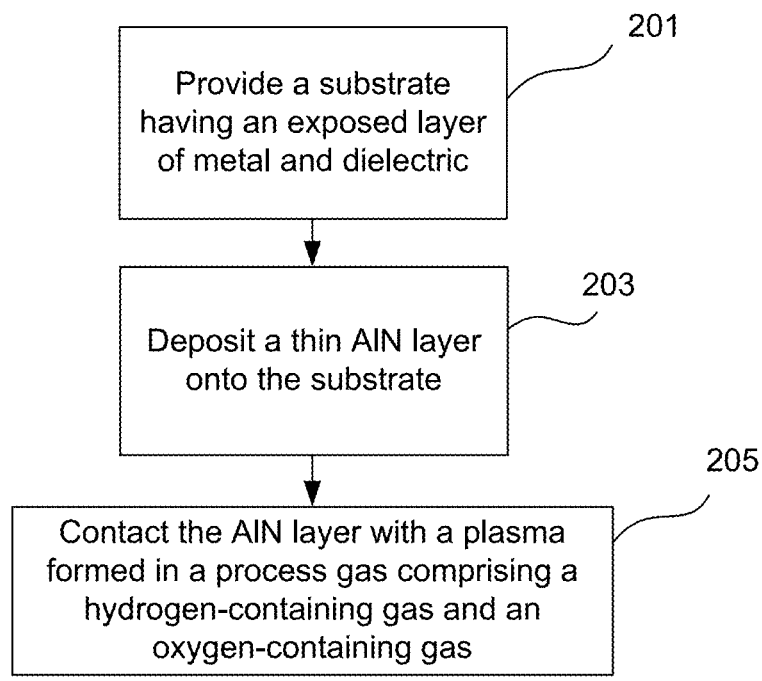
FIG. 2 is a process flow diagram for a method of oxidatively treating AlN film according to an embodiment provided herein.

The treatment methods are illustrated by FIGS. 1A-1C showing cross-sectional depictions of an example of a substrate undergoing processing, and by FIG. 2, which provides an illustrative process flow diagram for the processing method.

Referring to FIG. 2, the process starts in 201 by providing a substrate containing an exposed layer of metal and dielectric. An example of a suitable substrate 100 is shown in FIG. 1A, which illustrates a layer of dielectric 103 and a layer of metal 107, embedded into the dielectric. A thin diffusion barrier layer 105 may separate the layer of metal 107 and the dielectric layer 103, preventing diffusion of metal into the dielectric. A variety of metals may be used for layer 107, such as copper, tungsten, and the like. The dielectric may include silicon oxide based dielectric (e.g., silicon oxide deposited by chemical vapor deposition), an organic dielectric, a porous dielectric, etc. When metal is copper, the diffusion barrier layer 105 is typically a copper diffusion barrier material, such as tantalum nitride or titanium nitride. In one of the embodiments the metal layer is a tungsten layer embedded into a layer of silicon oxide deposited by chemical vapor deposition (CVD).

Referring again to FIG. 2, in operation 201, a layer of AlN is deposited onto the substrate. The resulting structure is shown in FIG. 2B, where the AlN layer 109 is deposited over the planar surface containing dielectric and metal. The AlN layer in some embodiments has a thickness of less than about 100 Å, such as less than about 50 Å. In some embodiments the thickness of the AlN layer is between about 10-100 Å, such as between about 10-50 Å, e.g., between about 10-30 Å. The AlN layer can be deposited by any suitable method, such as by CVD, physical vapor deposition (PVD), or by atomic layer deposition (ALD). In one ALD embodiment the substrate is provided to an ALD apparatus process chamber and the substrate is contacted with a volatile or gaseous aluminum-containing compound, such as an organoaluminum compound (e.g., trimethylaluminum (TMA)) in an absence of plasma. The aluminum-containing compound is typically provided in a mixture with a carrier gas, such as nitrogen, helium, argon or any combination of these gases. The aluminum-containing compound is adsorbed to the exposed surface of the substrate, and the chamber is then purged and/or evacuated to remove the aluminum-containing compound from the chamber. Next, a reactive nitrogen-containing compound, such as $NH_3$ is provided into the process chamber, and is allowed to react with the aluminum containing compound adsorbed on the surface of the substrate and form AlN. The chamber is then purged and/or evacuated and the process is repeated until an AlN layer of desired thickness is formed. For example, deposition of 20 Å of AlN involves, in one embodiment about 28 cycles, wherein each cycle includes contacting the substrate with TMA, and, separately, with $NH_3$.

The AlN layer as-deposited is typically not suitable for use as an etch stop layer because it exhibits excessive leakage current, and, therefore, it needs to be post-treated to improve its electrical characteristics. Oxidative plasma post-treatment, with a plasma formed in an oxygen-containing gas, such as $CO_2$, can reduce the leakage current to acceptable value. However, such oxidative treatment can lead to inadvertent undesired oxidation of an underlying metal layer (e.g., tungsten or copper layer). This effect is particularly pronounced in thin AlN films. It is believed that oxidizing radicals can pass through the thin AlN layer and cause oxidative damage of the underlying metal.

It was unexpectedly discovered that oxidative damage to the underlying layers can be substantially reduced when oxidative plasma treatment is performed using a plasma formed in a process gas that contains a hydrogen-containing gas (typically a reducing gas), in addition to the oxygen-containing gas (an oxidizing gas). Furthermore, unexpectedly it was found that addition of hydrogen-containing gases does not increase the leakage current of formed films. It was previously believed that introduction of hydrogen into the film should be avoided, because it results in increased leakage current. Thus, referring to FIG. 2, the process follows in operation 205 by contacting the AlN layer with a plasma formed in a process gas comprising a hydrogen-containing gas (e.g., $NH_3$, $N_2H_4$, $H_2$, $BH_3$, and mixtures thereof) and an oxygen-containing gas (e.g., $CO_2$, $N_2O$, $O_2$, and mixtures thereof). Further, the process gas can include a diluent gas, such as He, Ar, Ne, $N_2$, or any combination thereof. For example, in one specific embodiment, plasma is formed in a process gas consisting essentially of $CO_2$, $H_2$ and a diluent gas (e.g., helium or argon). In another specific embodiment, plasma is formed in a gas consisting essentially of $N_2O$, $NH_3$, and helium. The flow rates of each of the gasses, are in some embodiments less than about 10,000 sccm, such as less than about 9,000 sccm for a process chamber housing a single semiconductor wafer substrate. The oxidative plasma treatment can be carried out in any apparatus that is configured for generation of plasma, such as in a plasma enhanced chemical vapor deposition (PECVD) apparatus or a plasma enhanced atomic layer deposition (PEALD) apparatus. In some embodiments both the deposition of the AlN layer and oxidative plasma treatment are performed in a PEALD apparatus. The treatment is performed, in some embodiments at a process temperature of between about 300-400° C., such as between about 350-400° C. The pressure in these embodiments ranges between about 0.5-10 Torr, such as between about 0.8-5 Torr (e.g., between about 0.8-4.8 Torr). Plasma can be generated using a radio frequency (RF) generator. Radio Frequency (RF) plasma may be formed using either high frequency (HF) or dual frequency generation, where dual frequency includes both low frequency (LF) and HF generation. Example low-frequency RF frequencies may include, but are not limited to, frequencies between 50 kHz and 900 kHz. Example high-frequency RF frequencies may include, but are not limited to, frequencies between 1.8 MHz and 2.45 GHz. In one embodiment, the high frequency is 13.56 MHz, and the low frequency is 400 kHz. Suitable power for HF RF generation can be in a range of about 100-1000 W, such as 100-700 W for processing of a single wafer substrate. Suitable power for LF RF generation can be in a range of about 0-1000 W, such as 0-700 W for processing of a single wafer substrate. In some embodiments the substrate is treated with the plasma for about 2-30 seconds.

In some embodiments oxidizing treatment is performed using direct plasma. In these embodiments, the process gas is introduced into the process chamber housing the substrate, and plasma is formed in this chamber. In other embodiments, plasma is generated remotely from the process gas and is introduced into the process chamber housing the substrate. Plasma can be generated remotely from the process gas taken as a whole, or from individual components of the process gas with subsequent mixing.

After the AlN layer is modified using provided methods, the process can follow by depositing a second layer of ILD over the modified AlN layer. The second ILD layer may include for example a silicon oxide based dielectric. The second ILD layer is subsequently patterned. Patterning may involve etching the ALD material, while etching the modified AlN layer at a lower rate, such that the modified AlN layer serves as an etch stop layer during patterning. Provided modified AlN layer preferably exhibit etch selectivity of at least about 6 to 10 times versus ILD, where the etch selectivity refers to a ratio of ILD etch rate to modified AlN layer (AlO or AlON layer) etch rate.

Apparatus

Another aspect of the implementations disclosed herein is an apparatus configured to accomplish the methods described herein. A suitable apparatus includes hardware for accomplishing the process operations and a system controller having instructions for controlling process operations in accordance with the disclosed implementations. Hardware for accomplishing the process operations includes for example PEALD processing chambers or PECVD processing chambers. The apparatus that is suitable for oxidative treatment of the AlN layer includes a process chamber having a support for holding the substrate during treatment, and a system for forming a plasma in a process gas.

In some embodiments the oxidative treatment is conducted in a PEALD reactor which is a part of a Vector Excel deposition module available from Lam Research Corp. of Fremont, Calif. A suitable process chamber includes a support for holding the wafer substrate during deposition (wafer pedestal), a generator for forming plasma in the process chamber, and conduits for delivering the components of the process gas ($CO_2$, $H_2$, argon, helium, etc.) to the process chamber. The apparatus is further configured for purging and/or evacuating the process chamber, and for maintaining a desired pressure and temperature in the process chamber during deposition. In some embodiments the apparatus is configured for depositing the AlN layer and for oxidatively treating the AlN layer in the same process chamber.

Examples of PEALD process chambers are described in U.S. Pat. Nos. 6,416,822, 6,428,859, and 8,747,964 which are herein incorporated by reference in their entireties.

Figure 3:
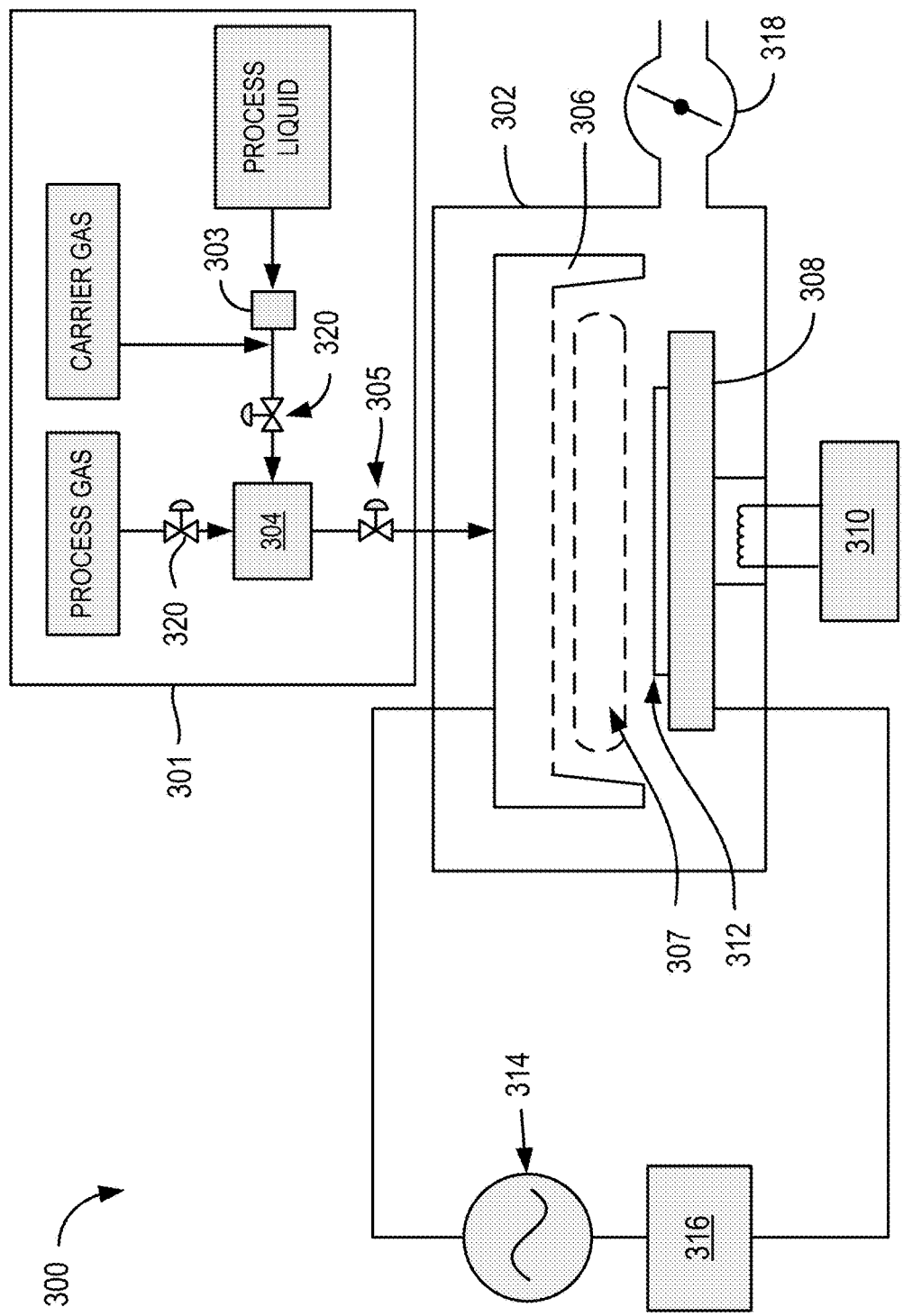
FIG. 3 is a schematic presentation of a PEALD process station that can be used for treatment of AlN films according to an embodiment provided herein.

FIG. 3 schematically shows an embodiment of a PEALD process station 300 that may be used to deposit and oxidatively treat provided AlN films. For simplicity, the process station 300 is depicted as a standalone process station having a process chamber body 302 for maintaining a low-pressure environment. However, it will be appreciated that a plurality of process stations 300 may be included in a common process tool environment. Further, it will be appreciated that, in some embodiments, one or more hardware parameters of process station 300, including those discussed in detail below, may be adjusted programmatically by one or more computer controllers.

Process station 300 fluidly communicates with reactant delivery system 301 for delivering process gases to a distribution showerhead 306. Reactant delivery system 301 includes a mixing vessel 304 for blending and/or conditioning process gases for delivery to showerhead 306. One or more mixing vessel inlet valves 320 may control introduction of process gases to mixing vessel 304. Similarly, a showerhead inlet valve 305 may control introduction of process gasses to the showerhead 306.

Some reactants, like TMA, may be stored in liquid form prior to vaporization at and subsequent delivery to the process station. For example, the embodiment of FIG. 3 includes a vaporization point 303 for vaporizing liquid reactant to be supplied to mixing vessel 304. In some embodiments, vaporization point 303 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 303 may be heat traced. In some examples, mixing vessel 304 may also be heat traced. In one non-limiting example, piping downstream of vaporization point 303 has an increasing temperature profile extending from approximately 100° C. to approximately 150° C. at mixing vessel 304.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 303. In one scenario, a liquid injector may be mounted directly to mixing vessel 304. In another scenario, a liquid injector may be mounted directly to showerhead 306.

In some embodiments, a liquid flow controller upstream of vaporization point 303 may be provided for controlling a mass flow of liquid for vaporization and delivery to process station 300. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 306 distributes process gases toward substrate 312. In the embodiment shown in FIG. 3, substrate 312 is located beneath showerhead 306, and is shown resting on a pedestal 308. It will be appreciated that showerhead 306 may have any suitable shape, and may have any suitable number and arrangement of ports for distributing processes gases to substrate 312.

In some embodiments, a microvolume 307 is located beneath showerhead 306. Performing an ALD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 308 may be raised or lowered to expose substrate 312 to microvolume 307 and/or to vary a volume of microvolume 307. For example, in a substrate transfer phase, pedestal 308 may be lowered to allow substrate 312 to be loaded onto pedestal 308. During a deposition process phase, pedestal 308 may be raised to position substrate 312 within microvolume 307. In some embodiments, microvolume 307 may completely enclose substrate 312 as well as a portion of pedestal 308 to create a region of high flow impedance during a deposition process.

Optionally, pedestal 308 may be lowered and/or raised during portions the deposition process to modulate process pressure, reactant concentration, etc., within microvolume 307. In one scenario where process chamber body 302 remains at a base pressure during the deposition process, lowering pedestal 308 may allow microvolume 307 to be evacuated. Example ratios of microvolume to process chamber volume include, but are not limited to, volume ratios between 1:900 and 1:10. It will be appreciated that, in some embodiments, pedestal height may be adjusted programmatically by a suitable computer controller.

In another scenario, adjusting a height of pedestal 308 may allow a plasma density to be varied during plasma activation and/or treatment cycles included in the deposition process. At the conclusion of the deposition process phase, pedestal 308 may be lowered during another substrate transfer phase to allow removal of substrate 312 from pedestal 308.

While the example microvolume variations described herein refer to a height-adjustable pedestal, it will be appreciated that, in some embodiments, a position of showerhead 306 may be adjusted relative to pedestal 308 to vary a volume of microvolume 307. Further, it will be appreciated that a vertical position of pedestal 308 and/or showerhead 306 may be varied by any suitable mechanism within the scope of the present disclosure. In some embodiments, pedestal 308 may include a rotational axis for rotating an orientation of substrate 312. It will be appreciated that, in some embodiments, one or more of these example adjustments may be performed programmatically by one or more suitable computer controllers.

Returning to the embodiment shown in FIG. 3, showerhead 306 and pedestal 308 electrically communicate with RF power supply 314 and matching network 316 for powering a plasma. In some embodiments, the plasma energy may be controlled by controlling one or more of a process station pressure, a gas concentration, an RF source power, an RF source frequency, and a plasma power pulse timing. For example, RF power supply 314 and matching network 316 may be operated at any suitable power to form a plasma having a desired composition of radical species. Examples of suitable powers are included above. Likewise, RF power supply 314 may provide RF power of any suitable frequency. In some embodiments, RF power supply 314 may be configured to control high- and low-frequency RF power sources independently of one another. Example low-frequency RF frequencies may include, but are not limited to, frequencies between 50 kHz and 900 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of the process gas and/or its individual components (e.g., a hydrogen-containing gas, an oxygen-containing gas, a diluent gas), instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition and/or treatment processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 308 may be temperature controlled via heater 310. Further, in some embodiments, pressure control for deposition process station 300 may be provided by butterfly valve 318. As shown in the embodiment of FIG. 3, butterfly valve 318 throttles a vacuum provided by a downstream vacuum pump (not shown). However, in some embodiments, pressure control of process station 300 may also be adjusted by varying a flow rate of one or more gases introduced to process station 300.

Figure 4:
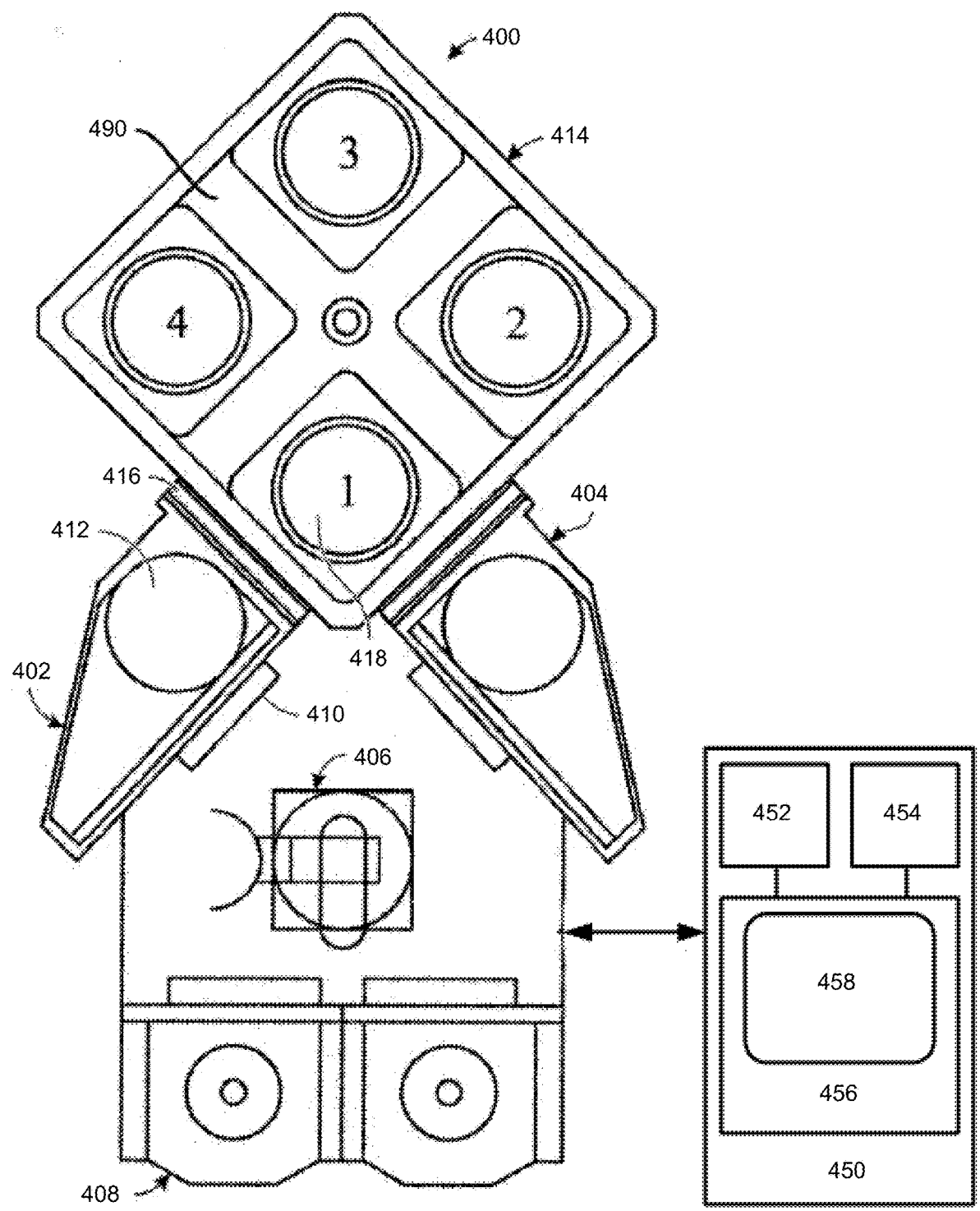
FIG. 4 shows a schematic view of a multi-station processing tool according to an embodiment provided herein.

In some embodiments, the substrates provided herein are processed in a multi-station tool. FIG. 4 shows a schematic view of an embodiment of a multi-station processing tool 400 with an inbound load lock 402 and an outbound load lock 404, either or both of which may comprise a remote plasma source. A robot 406, at atmospheric pressure, is configured to move wafers from a cassette loaded through a pod 408 into inbound load lock 402 via an atmospheric port 410. A wafer is placed by the robot 406 on a pedestal 412 in the inbound load lock 402, the atmospheric port 410 is closed, and the load lock is pumped down. Where the inbound load lock 402 comprises a remote plasma source, the wafer may be exposed to a remote plasma treatment in the load lock prior to being introduced into a processing chamber 414. Further, the wafer also may be heated in the inbound load lock 402 as well, for example, to remove moisture and adsorbed gases. Next, a chamber transport port 416 to processing chamber 414 is opened, and another robot (not shown) places the wafer into the reactor on a pedestal of a first station shown in the reactor for processing.

The depicted processing chamber 414 comprises four process stations, numbered from 1 to 4 in the embodiment shown in FIG. 4. Each station has a heated pedestal (shown at 418 for station 1), and gas line inlets. It will be appreciated that in some embodiments, each process station may have different or multiple purposes. While the depicted processing chamber 414 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 4 also depicts an embodiment of a wafer handling system 490 for transferring wafers within processing chamber 414. In some embodiments, wafer handling system 490 may transfer wafers between various process stations and/or between a process station and a load lock. It will be appreciated that any suitable wafer handling system may be employed. Non-limiting examples include wafer carousels and wafer handling robots. FIG. 4 also depicts an embodiment of a system controller 450 employed to control process conditions and hardware states of process tool 400. System controller 450 may include one or more memory devices 456, one or more mass storage devices 454, and one or more processors 452. Processor 452 may include a CPU or computer, analog and/or digital input/output connections, stepper motor controller boards, etc.

In some embodiments, system controller 450 controls all of the activities of process tool 400. System controller 450 executes system control software 458 stored in mass storage device 454, loaded into memory device 456, and executed on processor 452. System control software 458 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 400. System control software 458 may be configured in any suitable way. For example, various process tool component subroutines or control objects may be written to control operation of the process tool components necessary to carry out various process tool processes in accordance with the disclosed methods. System control software 458 may be coded in any suitable computer readable programming language.

In some embodiments, system control software 458 may include input/output control (IOC) sequencing instructions for controlling the various parameters described above. For example, each phase of an PEALD and oxidative post-treatment process may include one or more instructions for execution by system controller 450. The instructions for setting process conditions for the PEALD process phase may be included in a corresponding PEALD recipe phase, and the instructions for setting process conditions for the oxidative treatment process phase may be included in a corresponding oxidative treatment recipe phase. In some embodiments, the PEALD and oxidative treatment recipe phases may be sequentially arranged, so that all instructions for the PEALD process phase and oxidative treatment process phase are executed concurrently with that process phase.

Other computer software and/or programs stored on mass storage device 454 and/or memory device 456 associated with system controller 450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 418 and to control the spacing between the substrate and other parts of process tool 400.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 450. The user interface may include a display screen, graphical software displays of the apparatus and/or process conditions, and user input devices such as pointing devices, keyboards, touch screens, microphones, etc.

In some embodiments, parameters adjusted by system controller 450 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 450 from various process tool sensors. The signals for controlling the process may be output on the analog and digital output connections of process tool 400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, Calif., or any of a variety of other commercially available processing systems. Two or more of the stations may perform the same functions. Similarly, two or more stations may perform different functions. Each station can be designed/configured to perform a particular function/method as desired.

Figure 5:
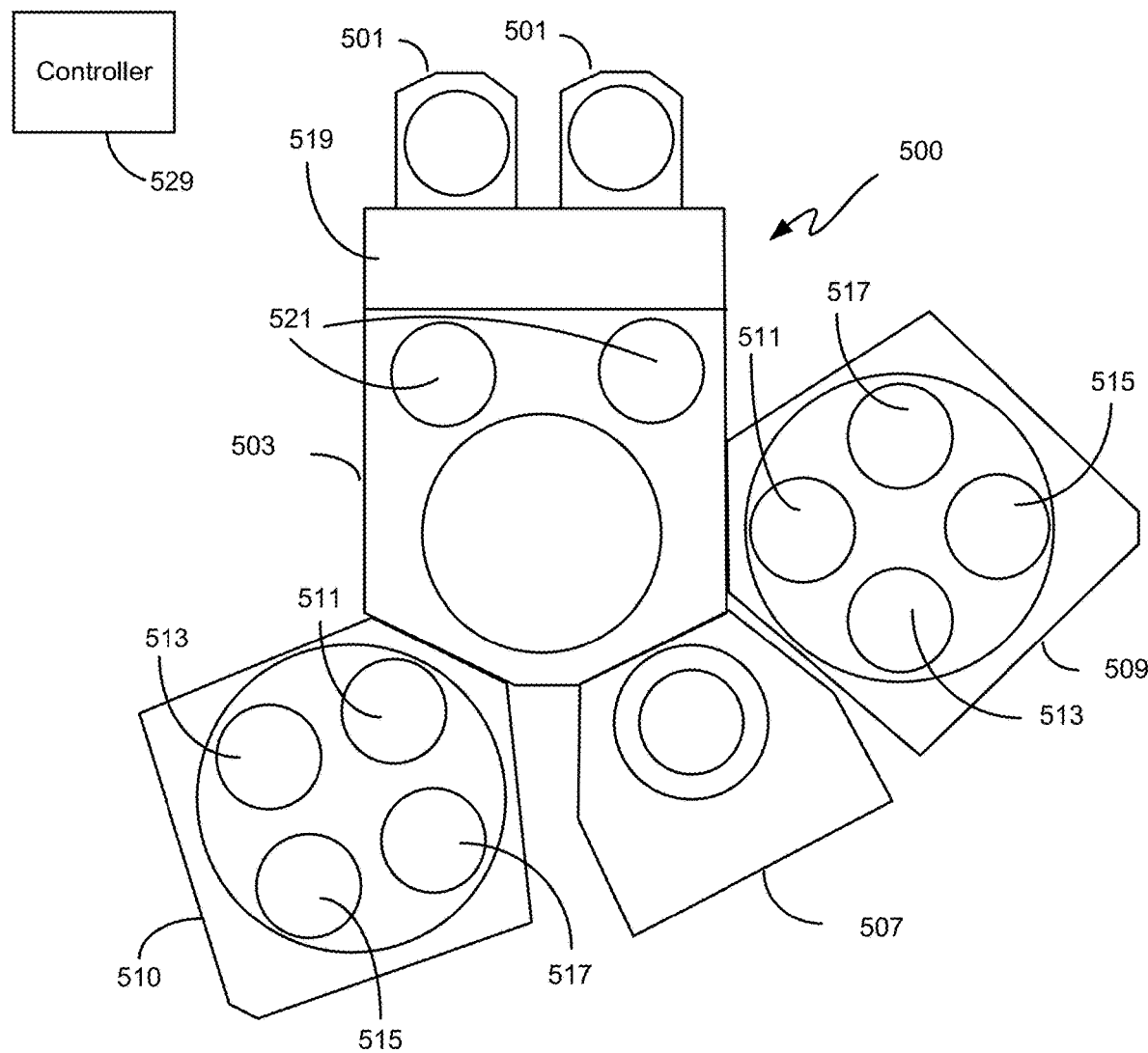
FIG. 5 is a block diagram of a processing tool configured for depositing and post-treating thin films according to an embodiment provided herein.
Figure 6:
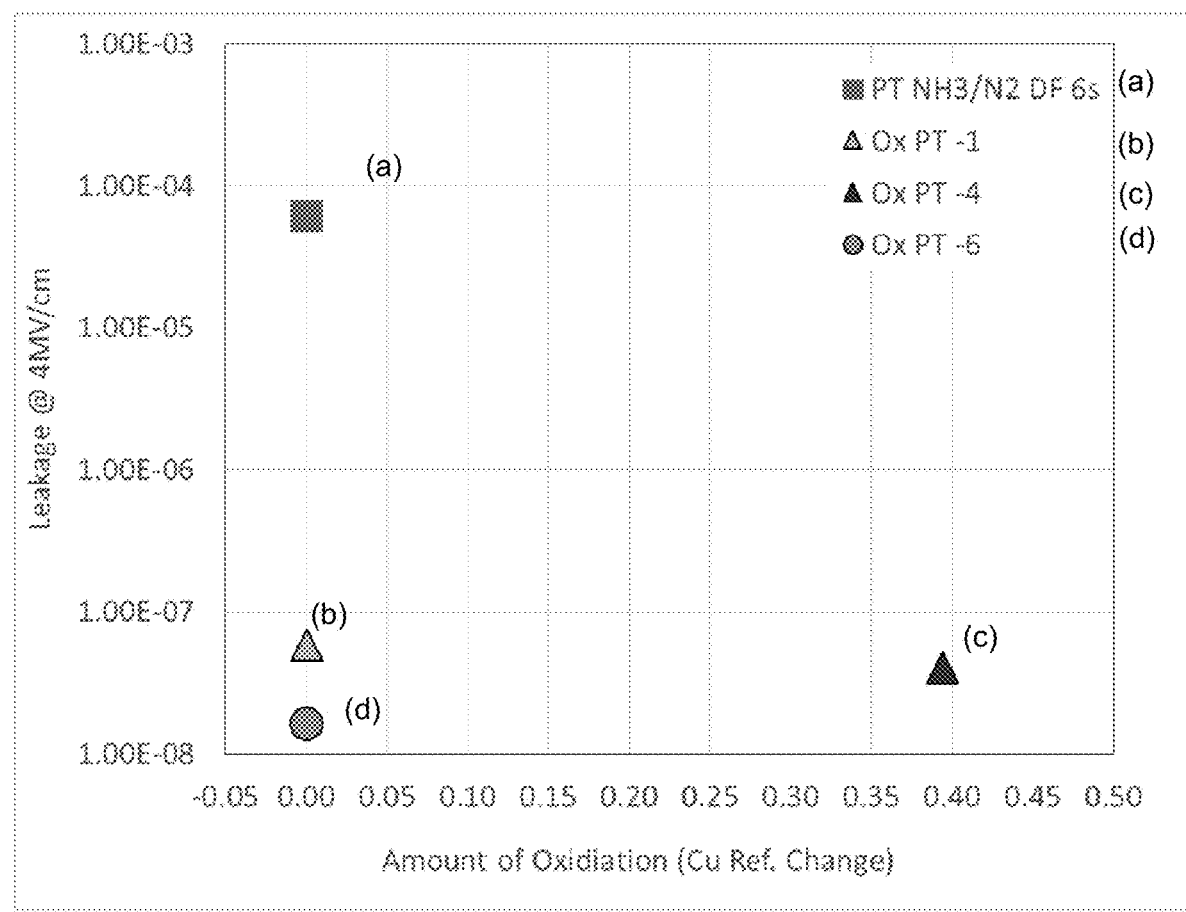
FIG. 6 is an experimental plot illustrating leakage current and reflectivity change for different films.
Figure 7:
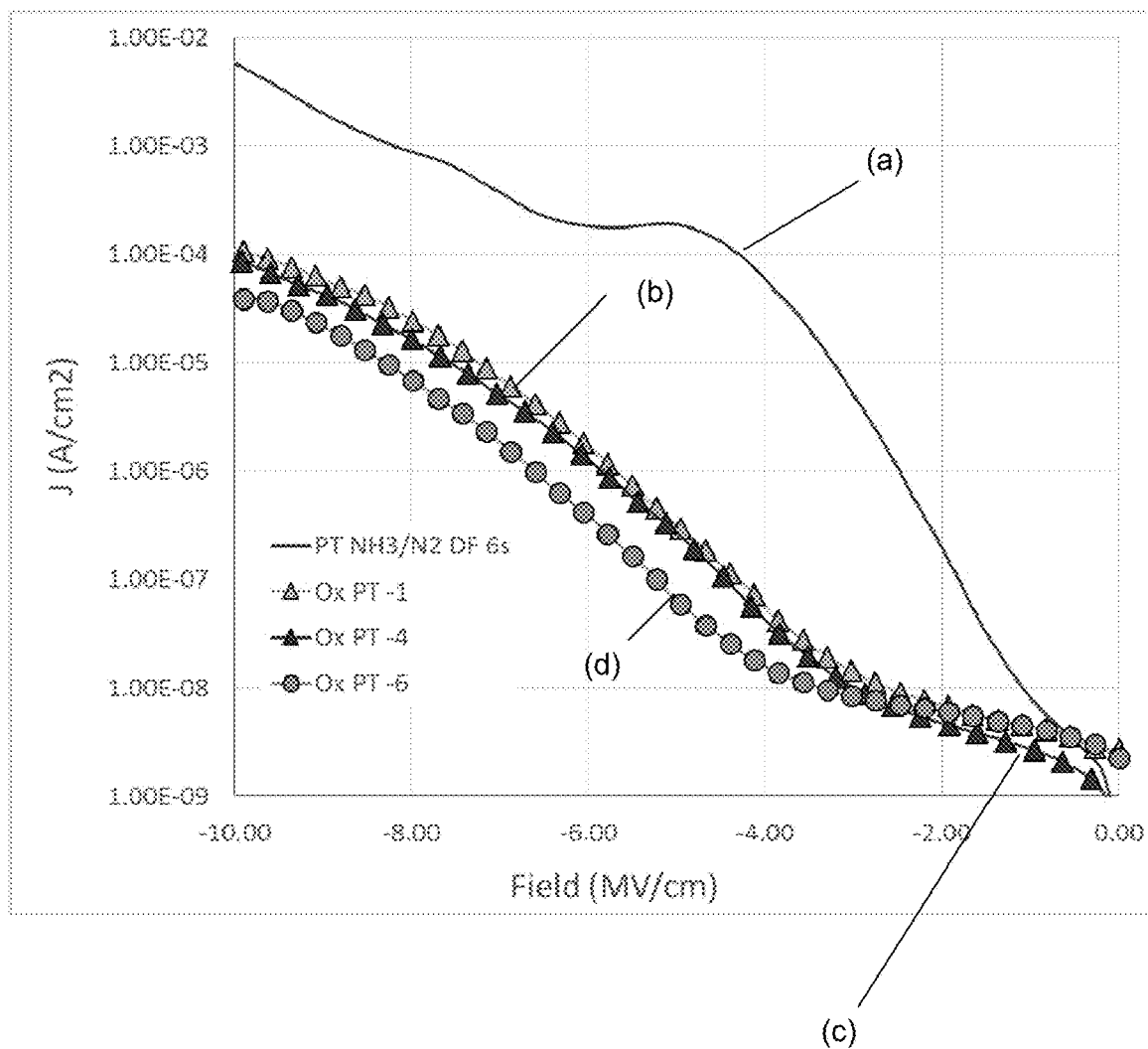
FIG. 7 is an experimental plot illustrating leakage current as a function of voltage for different films.

FIG. 5 is a block diagram of a processing system suitable for conducting thin film deposition and oxidative treatment processes in accordance with certain embodiments. The system 500 includes a transfer module 503. The transfer module 503 provides a clean, pressurized environment to minimize risk of contamination of substrates being processed as they are moved between various reactor modules. Mounted on the transfer module 503 are two multi-station reactors 509 and 510, each capable of performing atomic layer deposition (ALD) and/or chemical vapor deposition (CVD) according to certain embodiments. Reactors 509 and 510 may include multiple stations 511, 513, 515, and 517 that may sequentially or non-sequentially perform operations in accordance with disclosed embodiments. The stations may include a heated pedestal or substrate support, one or more gas inlets or showerhead or dispersion plate.

Also mounted on the transfer module 503 may be one or more single or multi-station modules 507 capable of performing plasma or chemical (non-plasma) pre-cleans, or any other processes described in relation to the disclosed methods. The module 507 may in some cases be used for various treatments to, for example, prepare a substrate for a deposition process. The module 507 may also be designed/configured to perform various other processes such as etching or polishing. The system 500 also includes one or more wafer source modules 501, where wafers are stored before and after processing. An atmospheric robot (not shown) in the atmospheric transfer chamber 519 may first remove wafers from the source modules 501 to loadlocks 521. A wafer transfer device (generally a robot arm unit) in the transfer module 503 moves the wafers from loadlocks 521 to and among the modules mounted on the transfer module 503.

In various embodiments, a system controller 529 is employed to control process conditions during deposition. The controller 529 will typically include one or more memory devices and one or more processors. A processor may include a CPU or computer, analog and/or digital input/output connections, stepper motor controller boards, etc.

The controller 529 may control all of the activities of the deposition apparatus. The system controller 529 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 529 may be employed in some embodiments.

Typically there will be a user interface associated with the controller 529. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 529. The signals for controlling the process are output on the analog and digital output connections of the deposition apparatus 500.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 529 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 529, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Further Implementations

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

EXPERIMENTAL EXAMPLES

Example A (Comparative)

A 20 Å AlN layer was deposited by ALD (using sequential TMA and $NH_3$ exposure) on a substrate containing copper. No oxidative plasma treatment was performed. The substrate was treated for 6 seconds with a plasma formed from a process gas consisting of a mixture of $NH_3$ and $N_2$. The pressure during treatment was 2.6 Torr. Plasma was formed using dual frequency plasma generation. HF plasma was generated using 13.56 MHz frequency and a power of 560 W. LF plasma was generated using 400 kHz frequency and a power of 250 W.

Example B

A 20 Å AlN layer was deposited under the same process conditions as in Example A. The deposited layer was post-treated for 4 seconds with an oxidative plasma formed in a process gas consisting of $CO_2$ (provided at a flow rate of 8,000 sccm), $H_2$ (provided at a flow rate of 9,900 sccm) and helium (provided at a flow rate of 2,800 sccm) at a pressure of 2.4 Torr. Plasma was generated using the same frequency and power settings as in Example A.

Example C (Comparative)

A 20 Å AlN layer was deposited under the same process conditions as in Example A. The deposited layer was post-treated for 4 seconds with an oxidative plasma formed in a process gas consisting of $CO_2$ (provided at a flow rate of 8,000 sccm), and helium (provided at a flow rate of 2,800 sccm) at a pressure of 2.4 Torr. Plasma was generated using the same frequency and power settings as in Example A. Example C uses the same deposition and post-treatment conditions as Example B, but $H_2$ is not flowed during post-treatment.

Example D

A 20 Å AlN layer was deposited under the same process conditions as in Example A. The deposited layer was post-treated for 4 seconds with an oxidative plasma formed in a process gas consisting of $CO_2$ (provided at a flow rate of 8,000 sccm), and argon (provided at a flow rate of 2,800 sccm) at a pressure of 2.4 Torr. Plasma was generated using the same frequency and power settings as in Example A. Example D uses the same deposition and post-treatment conditions as Example B, but helium diluent was substituted with argon diluent.

Comparison of Films Provided in Examples A, B, C, and D.

Leakage current was measured for all samples using Hg probe. The leakage current (current) was measured while applying different voltages to the sample. Plots for leakage current as a function of field are provided in FIG. 5. Curves (a), (b), (c), and (d) correspond to films of Examples A, B, C, and D respectively. It can be seen that oxidative treatment in samples B, C, and D, substantially reduce the leakage current in comparison with sample A that did not undergo oxidative treatment. Leakage current values at 4 MV/cm were $6.2\times10^{-5}$ A/cm$^2$ for Example A, $5.8\times10^{-8}$ A/cm$^2$ for Example B, $4.0\times10^{-8}$ A/cm$^2$ for Example C, and $1.6\times10^{-8}$ A/cm$^2$ for Example C. Leakage improved (was reduced) by more than three orders of magnitude with the use of oxidative plasma treatment.

Damage of the underlying layers was measured using copper oxidation test. In this test, reflectivity of the substrate was measured before and after plasma post-treatment. Because AlN layer (before and after treatment) is transparent at the wavelength at which the reflectivity is measured, change in reflectivity provides an indication of damage to an underlying copper layer. The reflectivity value measured is a ratio of reflected light intensity to incoming light intensity. For copper typical reflectivity value is between 0.53-0.55. The reflectivity was measured at a wavelength of 440 nm using F5x-2 KLA Tencor ellipsometer. Substrates obtained in examples A, B, and D showed no change in reflectivity after plasma post-treatment. Substrate obtained in example C showed a change of 0.3939 indicating presence of oxidative damage to underlying copper. Leakage current at 4 MV/cm and reflectivity change for Examples A, B, C, and D were plotted in FIG. 3 as points (a), (b), (c), and (d) respectively. It can be seen that only points (b) and (d) corresponding to Examples B and D exhibit both low leakage current and no change in reflectivity. These results indicate that addition of $H_2$ during oxidative plasma treatment reduces oxidative damage to underlying films while lowering the leakage current.

What is claimed is:

1. A method for treating a layer of material on a semiconductor substrate, the method comprising:
  (a) depositing a layer of aluminum nitride on a semiconductor substrate; and
  (b) after the deposition of the aluminum nitride layer has been completed, contacting the semiconductor substrate in a process chamber with a plasma formed from a process gas comprising an oxygen-containing gas and $H_2$ to modify the aluminum nitride layer, wherein the plasma treatment in (b) comprises:
    (i) generating high frequency (HF) radio frequency (RF) plasma from the process gas comprising $H_2$ and the oxygen-containing gas, using a frequency of between 1.8 MHz and 2.45 GHz; and
    (ii) contacting the semiconductor substrate positioned on a support in the process chamber with a plasma that comprises the HF RF plasma and chemically modifying aluminum nitride in the deposited aluminum nitride layer to form a layer comprising Al and O, and thereby decreasing leakage current of the aluminum nitride layer, wherein the process chamber comprises an inlet for introducing the process gas or the plasma into the process chamber, and wherein the plasma is formed in the process chamber or outside of the process chamber housing the semiconductor substrate.

2. The method of claim 1, wherein the oxygen-containing gas comprises a gas selected from a group consisting of $CO_2$, $N_2O$, and $O_2$.

3. The method of claim 1, wherein the modified layer obtained after plasma treatment in (b) is an AlO layer or an AlON layer.

4. The method of claim 1, wherein the leakage current of the treated layer is less than about $2\times10^{-6}$ A/cm$^2$ at 4 MV/cm.

5. The method of claim 1, wherein the aluminum nitride layer resides over and in contact with a metal layer and a dielectric layer.

6. The method of claim 5, wherein the metal layer is a copper layer.

7. The method of claim 6, wherein the plasma treatment in (b) does not cause oxidation of the underlying copper layer that is detectable by reflectometry.

8. The method of claim 5, wherein the metal layer is a tungsten layer.

9. The method of claim 1, wherein the process gas further comprises a diluent gas.

10. The method of claim 1, wherein the process gas further comprises a diluent gas selected from the group consisting of He, Ar, Ne, $N_2$, and mixtures thereof.

11. The method of claim 1, wherein the aluminum nitride layer has a thickness of less than about 50 Å.

12. The method of claim 1, wherein the aluminum nitride layer has a thickness of between about 10-30 Å.

13. The method of claim 1, wherein the oxygen-containing gas is $CO_2$ and wherein the plasma treatment in (b) modifies the aluminum nitride layer to form an AlO or AlON layer.

14. The method of claim 1, wherein the process chamber is a plasma-enhanced atomic layer deposition (PEALD) or a plasma-enhanced chemical vapor deposition (PECVD) process chamber.

15. The method of claim 1, wherein (b) further comprises forming low frequency (LF) radio frequency (RF) plasma.

16. The method of claim 1, wherein (b) comprises treating the substrate with a plasma at a pressure of between about 0.5-10 Torr and at a process temperature of between about 300-400° C.

17. The method of claim 1, further comprising:
  applying photoresist to the semiconductor substrate;
  exposing the photoresist to light;
  patterning the photoresist and transferring the pattern to the semiconductor substrate; and selectively removing the photoresist from the semiconductor substrate.

* * * * *